(12) United States Patent
Todd et al.

(10) Patent No.: US 11,392,733 B2
(45) Date of Patent: Jul. 19, 2022

(54) MULTI-DIMENSIONAL EVENT MODEL GENERATION

(71) Applicant: EMC IP Holding Company LLC, Hopkinton, MA (US)

(72) Inventors: Stephen J. Todd, Center Conway, NH (US); Assaf Natanzon, Tel Aviv (IL); Dragan Savic, Brookline, MA (US); Said Tabet, Sherborn, MA (US)

(73) Assignee: EMC IP Holding Company LLC, Hopkinton, MA (US)

( * ) Notice: Subject to any disclaimer, the term of this patent is extended or adjusted under 35 U.S.C. 154(b) by 895 days.

(21) Appl. No.: 16/053,942

(22) Filed: Aug. 3, 2018

(65) Prior Publication Data

US 2020/0042657 A1 Feb. 6, 2020

(51) Int. Cl.
*G06F 30/20* (2020.01)
*G06T 17/05* (2011.01)

(52) U.S. Cl.
CPC .............. *G06F 30/20* (2020.01); *G06T 17/05* (2013.01)

(58) Field of Classification Search
CPC ................................ G06F 30/20; G06T 17/05
See application file for complete search history.

(56) References Cited

U.S. PATENT DOCUMENTS

| 2020/0010093 A1* | 1/2020 | Li ..................... B60W 50/00 |
| 2020/0017117 A1* | 1/2020 | Milton ................. B60W 50/02 |
| 2020/0151971 A1* | 5/2020 | Ogawa ............... G06F 16/1834 |

OTHER PUBLICATIONS

U.S. Appl. No. 15/895,622 filed in the name of Stephen J. Todd et al., Feb. 13, 2018 and entitled "Point of Origin Capture for Data Compliance Management in Cloud Computing Environment."
U.S. Appl. No. 15/898,443 filed in the name of Kelly G. Kanellakis et al., Feb. 17, 2018 and entitled "Ad-Hoc Mobile Computing."
Satoshi Nakamoto, "Bitcoin: A Peer-to-Peer Electronic Cash System," http://bitcoin.org/bitcoin.pdf, 2008, 9 pages.
U.S. Appl. No. 16/047,718 filed in the name of Stephen J. Todd et al. Jul. 27, 2018 and entitled "Ad-Hoc Computation System Formed in Mobile Network."

* cited by examiner

*Primary Examiner* — Bijan Mapar
(74) *Attorney, Agent, or Firm* — Ryan, Mason & Lewis, LLP

(57) ABSTRACT

A physical event to be modeled is selected. A profile for the physical event is generated based on an event type of the physical event. Data is obtained from a plurality of data sources, wherein the obtained data comprises data relevant to the physical event that is collected by the plurality of data sources, and further wherein at least a portion of the obtained data comprises one or more of spatial and temporal references associated with the collection of the data. A digital representation of the physical event is generated based on at least a portion of the obtained data and the generated profile. The digital representation is utilized to analyze one or more other physical events associated with the modeled physical event.

20 Claims, 7 Drawing Sheets

100

400

510

CONTENT ARRIVAL WITH GEO-EXTRACTION
AND GEO-BASED POLICY PLACEMENT

DATA MANAGEMENT BLOCKCHAIN TRANSACTION WITH EMBEDDED GEO METADATA

500

CONTENT ARRIVAL

DATA MANAGEMENT BLOCKCHAIN TRANSACTION

MULTI-DIMENSIONAL EVENT MODEL GENERATION

FIELD

The field relates generally to information processing systems, and more particularly to techniques for generating digital representations, e.g., models, of physical events in such information processing systems.

BACKGROUND

There are many event use cases that would benefit from digital recall and/or simulation such as, but not limited to, accidents, natural disasters, car mechanical/electronic failures, etc. Limited digital event recall is possible today in some urban areas that are covered by multiple security cameras and "smart city" sensors. Smart city sensors are sensors that are configured to detect the presence of a wide variety of conditions in a given urban area such as, but not limited to, noise, radiation, chemical agents, biological agents, weather conditions, traffic congestion, crowd congestion, etc. For example, security camera data (audio and video) and/or sensor data (examples of which are given above) can be individually inspected to attempt to recreate a given physical event. However, there is a much larger subset of open roads and rural and/or city areas that do not have such security cameras or smart sensors and, thus, do not have digital event recall coverage.

SUMMARY

Embodiments of the invention provide techniques for generating digital representations of physical events in information processing systems.

For example, in one embodiment, a method comprises the following steps. A physical event to be modeled is selected. A profile for the physical event is generated based on an event type of the physical event. Data is obtained from a plurality of data sources, wherein the obtained data comprises data relevant to the physical event that is collected by the plurality of data sources, and further wherein at least a portion of the obtained data comprises one or more of spatial and temporal references associated with the collection of the data. A digital representation of the physical event is generated based on at least a portion of the obtained data and the generated profile. The digital representation is utilized to analyze one or more other physical events associated with the modeled physical event.

Advantageously, illustrative embodiments recreate a physical event by generating, in real-time, a multi-dimensional event model of a location in a particular timeframe associated with the physical event. Once created, an event model (referred to herein as an "event twin" since the model is intended to identically represent the actual event as closely as possible) provides a foundation for modeling past events and simulating future ones.

These and other features and advantages of the invention will become more readily apparent from the accompanying drawings and the following detailed description.

DETAILED DESCRIPTION

Figure 1:
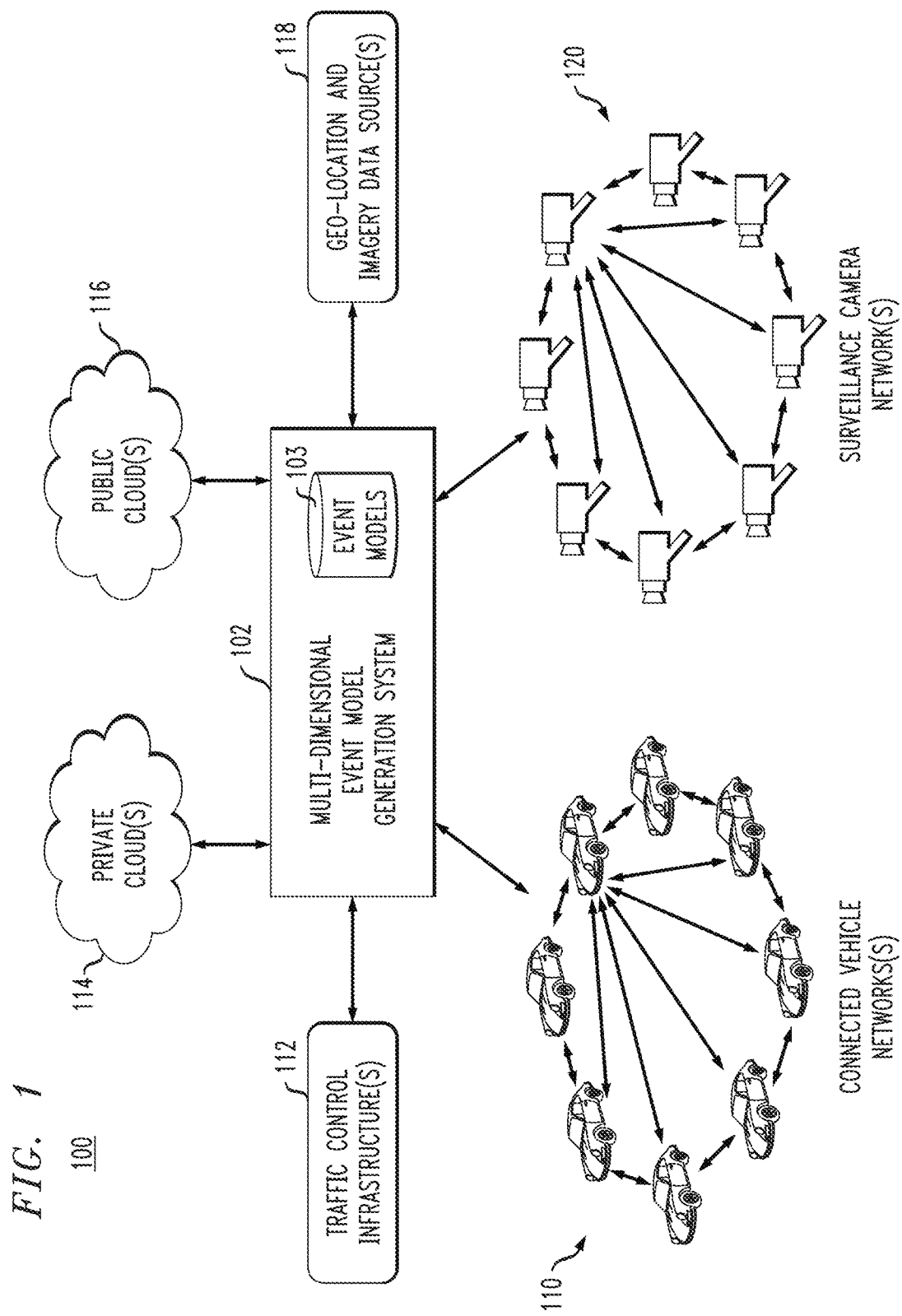
FIG. 1 illustrates an information processing system configured to generate multi-dimensional event models, according to an illustrative embodiment.

Illustrative embodiments will be described herein with reference to exemplary information processing systems and associated host devices, storage devices and other processing devices. It is to be appreciated, however, that embodiments are not restricted to use with the particular illustrative system and device configurations shown. Accordingly, the term "information processing system" as used herein is intended to be broadly construed, so as to encompass, for example, processing systems comprising cloud computing and storage systems, as well as other types of processing systems comprising various combinations of physical and virtual computing resources. An information processing system may therefore comprise, for example, a cloud infrastructure hosting multiple tenants that share cloud computing resources. Such systems are considered examples of what are more generally referred to herein as cloud computing environments. Environments that implement multiple cloud platforms are referred to as multi-cloud computing environments.

One or more cloud platforms that are part of this environment may be within the exclusive control and management of an enterprise, and therefore are considered "private clouds." On the other hand, the cloud computing environment can include one or more cloud platforms that can be used by multiple enterprises, and not necessarily controlled or managed by any of the multiple enterprises but rather are controlled and managed by one or more third-party cloud providers. Such cloud platforms are typically considered "public clouds." More typically, enterprises may choose to host their data (as well as applications, workloads, services, etc.) on a combination of private and public clouds that form a multi-cloud computing environment. One or more clouds may also be referred to as a "data center." Alternatively, a data center may be comprised of one or more clouds. The term "enterprise" as used herein is intended to be broadly construed, and may comprise, for example, one or more businesses, one or more corporations or any other one or more entities, groups, or organizations. An "entity" as illustratively used herein may be a person or system.

As mentioned above, there are many use cases that would benefit from recall and/or simulation of the physical event (i.e., actual, real-world event) in the form of a digital representation such as a multi-dimensional model. Non-limiting event use cases include traffic accidents, natural disasters, points of interest, car mechanical/electronic failures, as well as any type of domain-specific event such as agriculture and/or mining events. However, existing systems that might otherwise provide some form of digital recall (i.e., event data playback or event data rendering) are limited in nature. While illustrative examples given herein focus on vehicular accidents as physical events to be modeled, it should be understood that embodiments are not limited to any particular physical event type and therefore, in various embodiments, include other domain-specific events.

Some additional drawbacks associated with existing digital event recall approaches include the following.

No qualitative data. Qualitative data includes data elements that either directly receive qualitative/symbolic values for their attributes or qualitative value is derived from measured numeric/quantitative values. For example, measuring the impact of an accident uses qualitative values such as high, moderate, low. Access to a location of an event may also be measured with qualitative attributes with values easy, moderate, and difficult. When these values are derived from functions with numeric parameters, certain rules are applied to extract the qualitative values from predefined models.

It is realized herein that generating an accurate model requires strong profiling. For example, a profile of an accident is considered an abstract class, i.e., a representation of a type of event. In existing digital recall, data is currently not funneled to profiles containing attributes as qualitative fields. Illustrative embodiments will be explained that provide such functionalities.

No suitability criteria. It is further realized herein that to reduce cognitive dissonance (e.g., a state of holding multiple inconsistent interpretations of some principle), profiles of events are modeled using hypothetical scenarios or cases. In one or more embodiments, each case or scenario describes a suitability criterion as an object instance with qualitative value attributes. For example, in some embodiments, events such as accidents are characterized by multiple scenarios.

There is no existing process for generating qualitative profiles leveraging these suitability criteria, which is realized herein to be an important step in prioritizing amongst multiple events in a given time period. Illustrative embodiments will be explained that provide such functionalities.

No profiling mechanism. A profiling mechanism in accordance with illustrative embodiments is a process by which a given event is semantically enriched to generate a set of information that is used to target the relevant data surrounding this event. Examples of such data include, but are not limited to, external information, metadata, vehicle data, surrounding objects, etc.

In existing approaches, when an event occurs, there is no ability to target the relevant sets of data in the field that are key to that event. Illustrative embodiments will be explained that provide such functionalities.

No framework to detect and pull/sort/organize relevant data necessary to build multi-dimensional models. Existing frameworks do not find and connect relevant data based on geographic location (geo-location) and timestamps for multi-dimensional models (e.g., three-dimensional or 3D) as required by the predefined profiles. Illustrative embodiments will be explained that provide such functionalities.

No framework exists that can create multi-dimensional models. Existing digital recall frameworks do not support the creation of multi-dimensional models for a target location given a specified time. There is no framework allowing the processing of relevant data and the generation of multi-dimensional models. Illustrative embodiments will be explained that provide such functionalities.

Accordingly, illustrative embodiments provide techniques for generating digital representations (e.g. models) of physical events in information processing systems. Such information processing system environments, in illustrative embodiments, include a wide variety of computing resources. The term "computing resource," as illustratively used herein, can refer to any device, endpoint, component, element, platform, vehicle, camera, satellite, traffic control device, cloud, data center, storage array, client, server, gateway, or other resource, that is part of a computing environment. An example of an information processing system is shown in FIG. 1.

As shown in FIG. 1, information processing system 100 comprises a multi-dimensional event model generation system 102 operatively coupled to a plurality of data sources from which system 102 receives data to perform generation of one or more models 103. Again, it is to be understood that embodiments are not limited to any particular type of data source since, depending on the event type being modeled, relevant data sources may differ between event domains.

In this illustrative embodiment of FIG. 1, directed to vehicular accident events, the plurality of data sources comprises a connected vehicle network 110, traffic control infrastructure 112, a private cloud platform 114, a public cloud platform 116, geo-location and imagery data source 118, and a surveillance camera network 120. Note that the "(s)" after each of the terms cloud, network, source, and infrastructure is intended to indicate that, in some embodiments, the system 102 receives data from one or more such sources of data. Depending on the physical event being modeled, in other embodiments, multi-dimensional event model generation system 102 is operatively coupled to other sources to receive data relevant to the model generation.

In one or more embodiments, multi-dimensional event model generation system 102 is configured to create one or more digital representations of an event on-demand, i.e., models 103. As will be further explained herein, multi-dimensional event model generation system 102 enables enrichment of the relationship between physical events and their digital representations.

Connected vehicle network 110 is one example of a "connected car" system environment. A connected car system environment comprises a network of mobile compute platforms or MCPs (each MCP comprising computing resources that provide compute, storage and/or network capabilities) residing in autonomous cars (self-driven vehicles) and/or non-autonomous cars (human-driven vehicles). The MCPs are configured to receive data from and send data to: (i) fixed (stationary) computing resources such as edge servers associated with traffic control infrastructure 112 such as, but not limited to, electronic road signs and traffic lights (i.e., road signs and traffic lights that, respectively, have some level of computing, storage and/or electronic data communication capabilities); (ii) one or more other MCPs; and/or (iii) other computing resources. In some embodiments, data that is transferred in the system environment can originate and/or terminate at a cloud platform (e.g., private cloud platform 114 and/or public cloud platform 116)

depending on the direction of data flow. The communication capabilities of a connected car and electronic road signs and traffic lights can include cellular and local wireless (e.g., WiFi) communication equipment for sending and receiving data.

Within connected vehicle network 110, in some embodiments, multiple connected cars combine their computing resources to form ad-hoc mobile clusters. For example, in U.S. Ser. No. 15/898,443, filed on Feb. 17, 2018 and entitled "Ad-Hoc Mobile Computing," the disclosure of which is incorporated by reference herein in its entirety, an architecture is described in which "nearby" MCPs can be combined to form a "computer" in which the CPUs, memory, network, and storage are built-up/torn-down to perform compute tasks. Such architecture creates a full "virtual download" and quickly accesses missing chunks of needed data by paging them in from other MCPs and/or other sources.

Furthermore, MCP clusters in connected vehicle network 110 can be formed using one or more of the techniques described in U.S. Ser. No. 16/047,718, filed on Jul. 27, 2018 and entitled "Ad-Hoc Computation System in Mobile Network," the disclosure of which is incorporated by reference herein in its entirety. In these techniques, one or more ad-hoc portals are used to manage registration of MCPs that will take part in the execution of computation tasks.

It is to be understood that MCPs can be implemented in forms other than connected cars. For example, MCPs can be implemented in employee mobile devices, customer mobile devices, other vehicles (e.g., drones, planes, trucks, other shipping transports, etc.), Internet of Things (IoT) devices (e.g., sensors, tags, other monitoring or display systems, etc.), etc.

Private and public cloud platforms 114 and 116 provide various forms of cloud-based data to the model generation process performed by system 102. Examples of public clouds may include, but are not limited to, Amazon Web Services® (AWS), Google Compute Engine® (GCE), and Microsoft Azure® Services platforms. While the FIG. 1 embodiment illustrates a private cloud platform 114 and a public cloud platform 116, alternative embodiments include only a private cloud, multiple private clouds, only a public cloud, multiple public clouds, or no clouds at all. Cloud-based data includes any data that the multi-dimensional event model generation system 102 may need to generate a model of a domain-specific event. In one example given the FIG. 1 embodiment, either or both of cloud platforms 114 and 116 provide any data that is not necessarily accessible from one or more of the other data sources.

Furthermore, geo-location and imagery data source 118, in some embodiments, includes an extraterrestrial satellite system configured to provide geographic location (geo-location) information (e.g. Global Positioning System or GPS) of elements involved in the physical event being modeled (e.g., geo-locations of MCPs, traffic control infrastructure, and the area of the event itself) and imagery data of such elements (e.g., satellite views of geographic locations associated with physical events being modeled). Such data is provided to multi-dimensional event model generation system 102 for use in generating an event model 103, as will be further explained below.

Surveillance camera network 120 comprises a plurality of connected digital cameras that are capable of recording audio, images and/or video of elements associated with the physical event being modeled. In some embodiments, surveillance camera network 120 includes interconnected or individual security cameras in the vicinity of the physical event being modeled. Such cameras provide different views of the physical event that enable generation of a 3D model.

Still further, in various other embodiments, system 102 is configured to use data and metadata collected from a variety of other sources, e.g., processed and raw data from vehicle sensors, camera and radar images, smart city sensors, edge devices, mobile data centers, etc. The system 102 processes the data and metadata on-demand, in both space and time dimensions (e.g., 3D hologram), allowing reproduction and analysis of events that occur in specific locations, time and under predefined scenarios.

Figure 2:
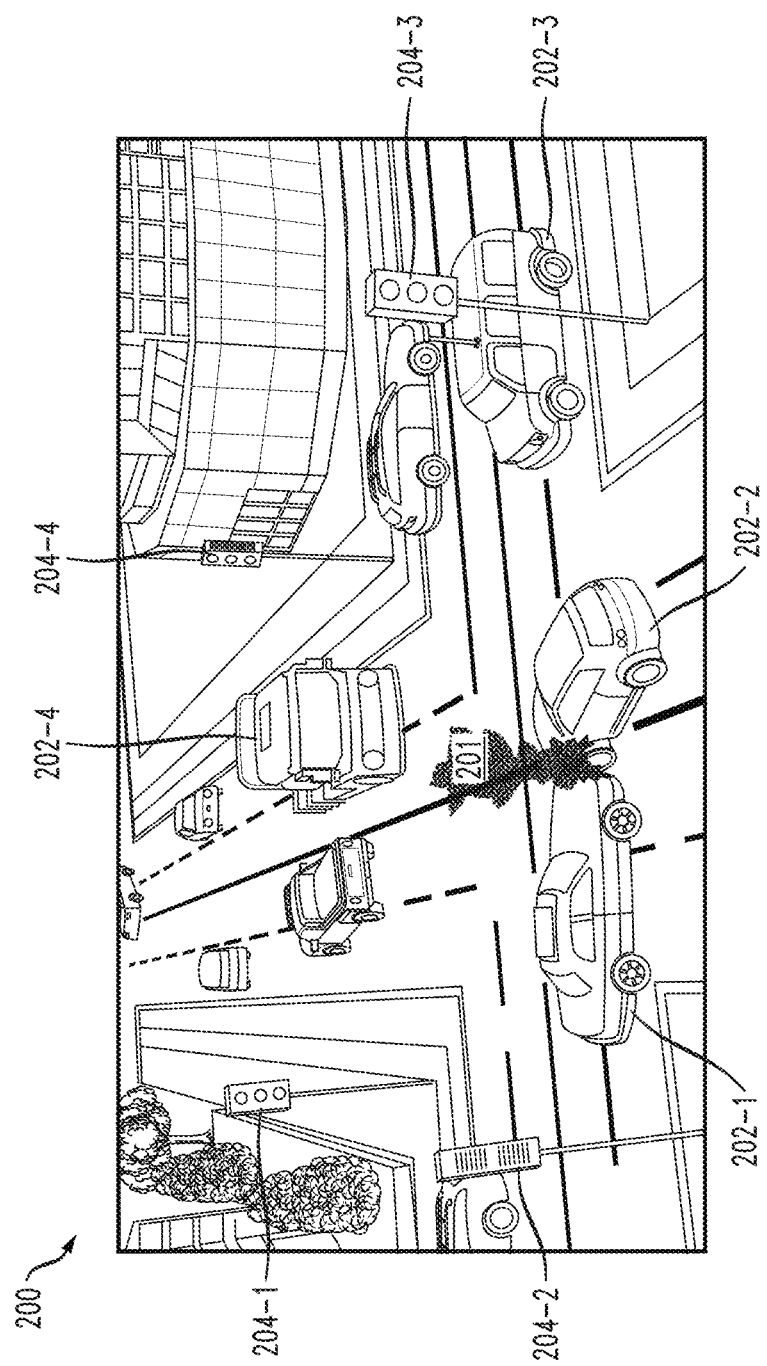
FIG. 2 illustrates an example of a physical event for which a multi-dimensional event model is generated in accordance with the information processing system of FIG. 1.

FIG. 2 illustrates an example of a physical event for which a multi-dimensional event model 103 is generated in accordance with the information processing system of FIG. 1. In example 200, the physical event is a traffic accident 201. System 102 is configured to virtually recreate the traffic accident 201 as a digital representation (model 103) at a specific time in the past or during a specified time window. In some embodiments, the model 103 of traffic accident 201 is generated in "real-time." By real-time, it is meant that the model is generated contemporaneous with the occurrence of the physical event.

Assume that the traffic accident 201 occurs in a traffic intersection between two vehicles 202-1 and 202-2. Further assume that one or both vehicles 202-1 and 202-2 are part of connected vehicle network 110 and thus configured with MCPs capable of collecting data relevant to the accident from one or more on-board sensors and data capture subsystems (e.g., images, video, speed, weather conditions, vehicle driving system status, driver status, etc.). Likewise, assume that other vehicles around the traffic accident are also configured with MCPs capable of collecting similar data, e.g., vehicles 202-3 and 202-4.

Still further, assume that one or more traffic control devices such as the four traffic lights 204-1, 204-2, 204-3, and 204-4 at the intersection where the traffic accident occurred are part of traffic control infrastructure 112 and configured to collect real-time data including, but not limited to, images, video, speed of vehicles in the area, weather conditions, observable driver status, traffic control signal status, etc.

Also, while not expressly shown, assume that the intersection where the accident 201 occurred is monitored by one or more surveillance cameras in network 120, and assume that the area of the accident is covered by a satellite system (data source 118) configured to provide geo-location data for the vehicles 202 and traffic control devices 204, as well as imagery data of the accident scene.

Further assume that current and/or historical traffic pattern data for the given intersection where accident 201 occurred, as well as data describing the vehicles 202-1 and 202-2 and/or drivers of the vehicles 202-1 and 202-2, is accessible from one or more of private cloud platform 114 and public cloud platform 116.

To recreate the traffic accident event 201, a multi-dimensional model of the location including all relevant stationary objects (e.g. parked or otherwise stopped cars, traffic control devices 204-1 through 204-4, etc.) and moving objects (e.g., cars 202-1 and 202-2 involved in the accident and other moving cars 202-3 and 202-4 in the immediate area) in a particular time frame needs to be generated. For the given traffic accident event 201, assume that all or portions of the above-mentioned collected data relating to example 200 is used by multi-dimensional event model generation system 102 to generate such an event model. Once created, an event model (also referred to herein as an "event twin") provides the foundation for modeling past events and simulating future ones.

As will be explained in further detail herein, the on-demand creation by multi-dimensional event model generation system 102 of one or more multi-dimensional models 103 utilizes: (i) a model profile; and (ii) relevant data captured and stored from multiple data sources. The event model 103 (or event twin or event replica) is a digital representation of an event (e.g., traffic accident 201) that can be used to provide insight into how the elements of the event operated and interacted throughout a given time period. Once created, an event twin can be used alone or together with other already existing event twins to emulate simple or complex past events and to model different future events. The event twin is defined with its qualitative profile, as will be further explained below. The profile defines the following: (i) participating elements of the event; (ii) the precise geo-location of elements; and (iii) one or more precise time references.

Based on the elements, location, and time of the event being modeled, various historical event-relevant data and metadata are collected from multiple sources (e.g., see description above for FIG. 2). Once data and metadata are collected, in one or more embodiments, artificial intelligence (AI) and software (SW) analytics tools (e.g., resident in multi-dimensional event model generation system 102) are used to process event-relevant data (based on rules and other AI techniques defined by the profile) and create a digital simulation model, i.e., the event twin. Once created, in some embodiments, an event twin provides the foundation and the framework for modeling past and simulating future events.

Figure 3:
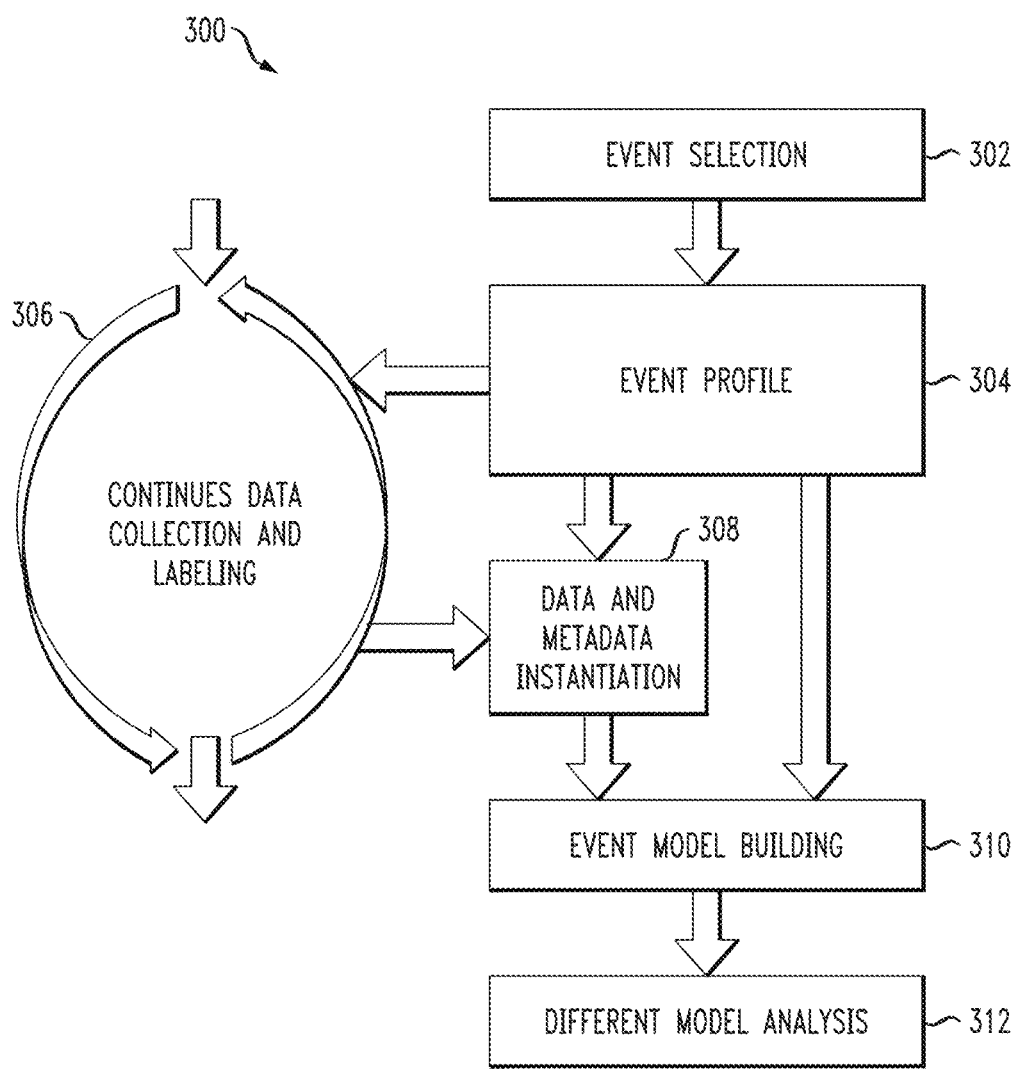
FIG. 3 illustrates a process flow associated with generating a multi-dimensional event model, according to an illustrative embodiment.

FIG. 3 illustrates an overall process flow 300 associated with generating multi-dimensional event models, according to an illustrative embodiment. It is to be appreciated that process flow 300 is performed by multi-dimensional event model generation system 102. As shown, process flow 300 comprises event selection step 302 followed by event profile creation and scoring step 304. After the event profile is obtained, data collection and data labelling from the various data sources occur (or otherwise continue, assuming that they have been occurring, based on filtering functionality provided by the scored profile as will be further explained below) in step 306. In step 308, data and metadata instantiation is performed. The event model is built in step 310 and is used in one or more analysis procedures in step 312, e.g., modeling past and simulating future events. Further details of these steps are described below.

Illustrative embodiments provide an improved method for accurate analysis of a specific event. The method uses input data and metadata (collectively considered "data"):

(i) collected from different sources (e.g., data from multiple vehicle sensors, cameras and radars, lidars, traffic light cameras, security cameras, cellphone cameras, satellite images, etc., as explained above);

(ii) related to a specific geographic location (e.g., specific GPS location, road intersection, parking, etc.);

(iii) over a specific time period; and (iv) enhanced by additional metadata points, e.g., as will be described below in the of FIGS. 4, 5A, and 5B.

Once the event to be modeled is selected in step 302 by a system administrator and/or another system, step 304 in certain embodiments creates and scores the profile of the event as follows. As mentioned above, a profile defines: participating event elements, the precise geo-locations of elements, and a precise time reference(s) for an event, e.g., pre-defined period of time. For example, if N is an event occurrence time instance, then in some embodiments model 103 covers past N−1, N−2, . . . , etc. time instances and future N+1, N+2, . . . , etc. time instances, with different time granularity. As further mentioned above, AI and SW analytic tools are used to create an abstract scored profile, specific to classes of events. In one or more embodiments, the scored profile is built by matching the qualitative representation of the event against stored suitability criteria case where each case match score becomes an attribute value of the scored profile. Based on event profile requirements, various historical event-relevant data and metadata are collected and labelled from multiple data sources in step 306.

Accordingly, in one or more illustrative embodiments, the scoring process associated with the profile is a mechanism used to intelligently filter relevant data from very large amounts of data around the particular event being modeled. Note that data sources 110 through 120, in some embodiments, provide large amounts of streaming data from different sources. Based on one or more scores generated for the profile, system 102 filters data and annotates the data sets to optimize their handling by the various downstream processing units of system 102. Advantageously, scoring allows the system 102 to apply qualitative criteria to determine whether or not the data is suitable for use in generating the event model. Labeling is a result of the scoring process and facilitates handling the data sets to achieve optimized processing of the event being modeled. In one non-limiting example, labeled data includes data from one or more of data sources 110 through 120 and metadata describing the one or more data sources.

In step 308, the collected and labelled data and metadata is instantiated based on the classification of the selected event. Instantiation refers to the process of creating property-value data pairs for the collected and labelled data (e.g., data property→value).

Once the data and metadata are collected, AI and SW analytic tools in step 310 are used to process event-relevant data based on rules defined by the profile created in step 304, and then create a digital simulation model, i.e., the event twin. In various embodiments, one or more conventional analytic tools are used including, but not limited to fuzzy logic, case-based reasoning and reinforced learning techniques. In some embodiments, these one or more analytic tools use the profile created and scored in step 304 for pattern matching operations in order to support a high level of precision with regard to their decision making algorithms. Other analytic tools that can be employed in embodiments of step 310 include, but are not limited to, 3D modeling tools which use images and/or videos from multiple sources to create a 3D model of the physical event. In some embodiments, AI tools include, but are not limited to, deep learning algorithms which help select the best possible model based on the data sources, i.e., the model which is most likely to describe what occurred in the physical event.

Once created, an event twin provides a foundation for modeling past and simulating future events. In one or more embodiments, the generated model enables different types of stereograms to be created and analyzed in step 312.

Figure 4:
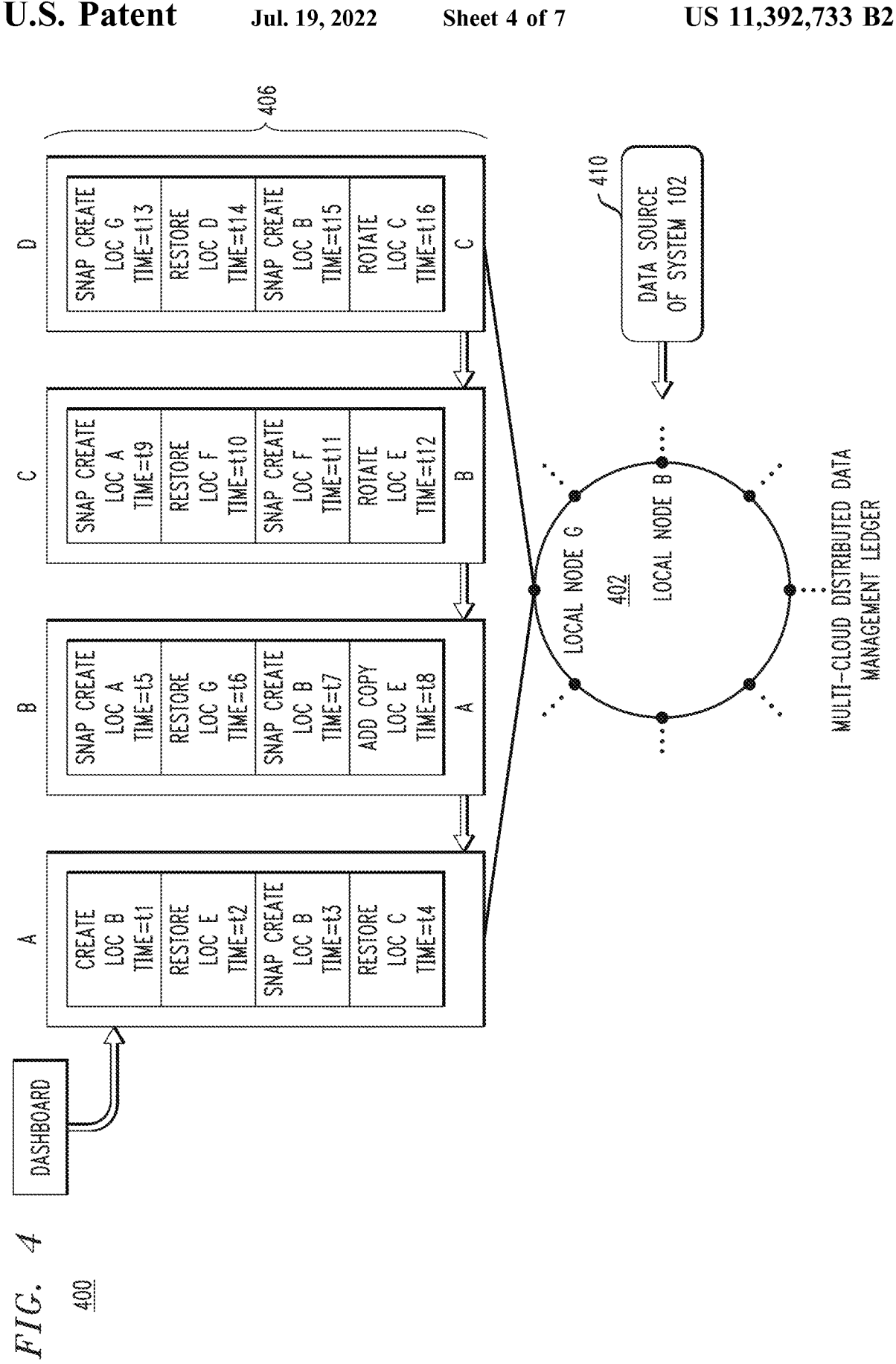
FIG. 4 illustrates a distributed data management ledger system for managing data associated with an information processing system configured to generate multi-dimensional event models, according to an illustrative embodiment.
Figure 5B:
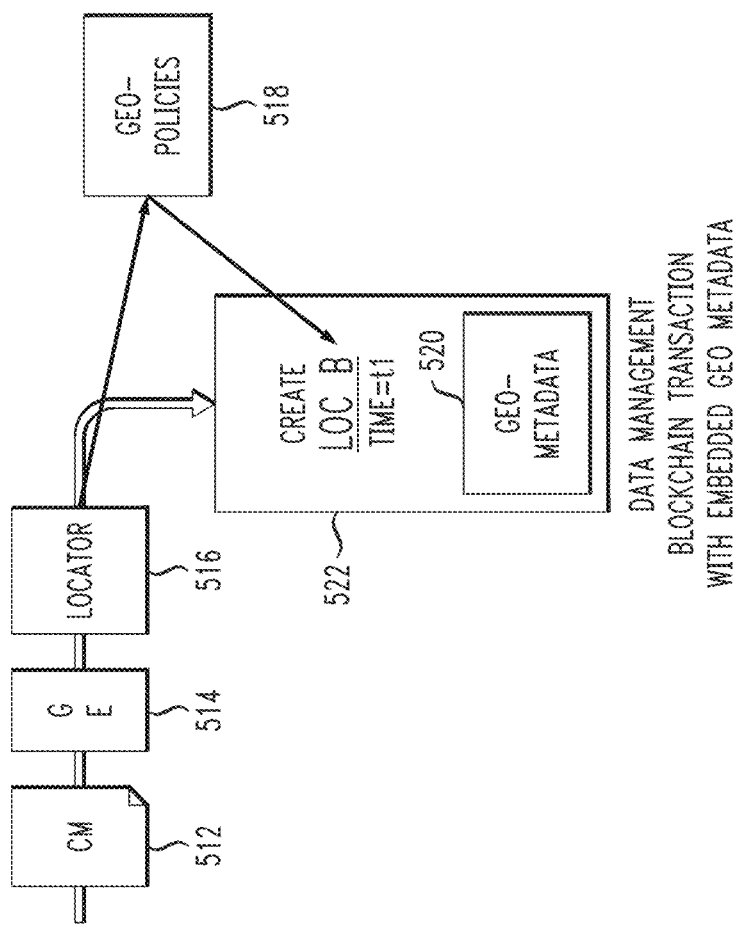
FIG. 5B illustrates content arrival with geo-extraction and geo-based policy placement operations during generation of a transaction with creation metadata that is added to the distributed data management ledger system of FIG. 4.
Figure 5A:
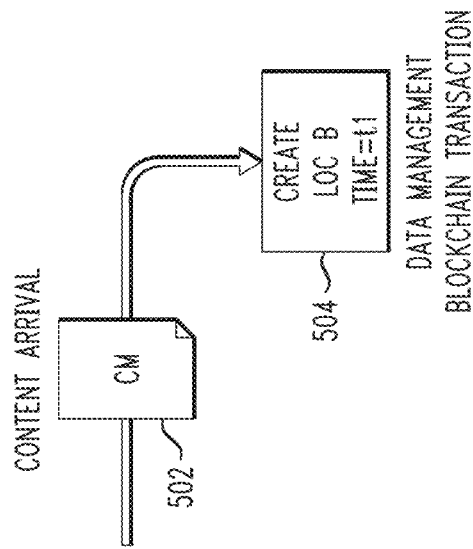
FIG. 5A illustrates content arrival and generation of a transaction with creation metadata added to the distributed data management ledger system of FIG. 4.

Turning now to FIGS. 4, 5A and 5B, in some embodiments, data and metadata collected in step 306 by the multi-dimensional event model generation system 102 is stored in a blockchain or other distributed ledger maintained in accordance with system 102. Further, system 102 and data sources 110 through 120 are configured to add geo-location information to the collected data that is stored or will be stored on the blockchain. By way of example, techniques described in U.S. Ser. No. 15/895,622, filed on Feb. 13, 2018 and entitled "Point of Origin Capture for Data Compliance Management in Cloud Computing Environment," the disclosure of which is incorporated by reference herein in its entirety, are employed in illustrative embodiments.

In one illustrative embodiment, a distributed data management ledger system is employed to securely maintain data and metadata collected for multi-dimensional event model generation system 102. The distributed data management ledger tracks the creation of data as well as recording the locations and times of any copy of the data being made as well.

As used herein, the terms "blockchain," "digital ledger" and "blockchain digital ledger" may be used interchangeably. As is known, the blockchain or digital ledger protocol is implemented via a distributed, decentralized computer network of compute nodes (e.g., blockchain nodes or BCNs). In some embodiments, each data source in FIG. 1, as well as system 102, comprises one or more such compute nodes. The compute nodes are operatively coupled in a peer-to-peer communications protocol. In the computer network, each compute node is configured to maintain a blockchain which is a cryptographically secured record or ledger of data blocks that represent respective transactions within a given computational environment. The blockchain is secured through use of a cryptographic hash function. A cryptographic hash function is a cryptographic function which takes an input (or "message") and returns a fixed-size alphanumeric string, which is called the hash value (also a message digest, a digital fingerprint, a digest, or a checksum). Each blockchain is thus a growing list of data records hardened against tampering and revision, and typically includes a timestamp, current transaction data, and information linking it to a previous block. More particularly, each subsequent block in the blockchain is a data block that includes a given transaction(s) and a hash value of the previous block in the chain, i.e., the previous transaction. That is, each block is typically a group of transactions. Thus, advantageously, each data block in the blockchain represents a given set of transaction data plus a set of all previous transaction data.

In the case of a "bitcoin" implementation of a blockchain distributed ledger, the blockchain contains a record of all previous transactions that have occurred in the bitcoin network. The bitcoin system was first described in S. Nakamoto, "Bitcoin: A Peer to Peer Electronic Cash System," 2008, the disclosure of which is incorporated by reference herein in its entirety.

A key principle of the blockchain is that it is trusted. That is, it is critical to know that data in the blockchain has not been tampered with by any of the compute nodes in the computer network (or any other node or party). For this reason, a cryptographic hash function is used. While such a hash function is relatively easy to compute for a large data set, each resulting hash value is unique such that if one item of data in the blockchain is altered, the hash value changes. However, it is realized that given the constant generation of new transactions and the need for large scale computation of hash values to add the new transactions to the blockchain, the blockchain protocol rewards compute nodes that provide the computational service of calculating a new hash value. In the case of a Bitcoin network, a predetermined number of bitcoins are awarded for a predetermined amount of computation. The compute nodes thus compete for bitcoins by performing computations to generate a hash value that satisfies the blockchain protocol. Such compute nodes are referred to as "miners." Performance of the computation of a hash value that satisfies the blockchain protocol is called "proof of work." While bitcoins are one type of reward, blockchain protocols can award other measures of value (monetary or otherwise) to successful miners.

It is to be appreciated that the above description represents an illustrative implementation of the blockchain protocol and that embodiments of the invention are not limited to the above or any particular blockchain protocol implementation. As such, other appropriate processes may be used to securely maintain and add to a set of data in accordance with embodiments of the invention. For example, distributed ledgers such as, but not limited to, R3 Corda, Ethereum, MultiChain, and Hyperledger may be employed in alternative embodiments.

FIG. 4 illustrates a distributed ledger system 400 for managing data and metadata associated with a multi-dimensional event model generation system 102, according to an illustrative embodiment. As generally illustrated, a plurality of blockchain nodes are operatively coupled to form a multi-cloud distributed data management ledger system 402. A given blockchain node or BCN in the ledger system serves as a local BCN for a given one of the data sources 110 through 120 and system 102 in FIG. 1. Thus, as illustratively shown in the distributed ledger system 402 in FIG. 4, respective BCNs (dark circles along the ring representing the ledger) are part of the ledger system for data sources 110 through 120 and system 102 in FIG. 1.

In this example, it is assumed that a data source 410 is one of the data sources 110 through 120 in FIG. 1. As contemplated in the distributed data management ledger system 402 depicted in FIG. 4, data source 410 is configured to store one or more transactions on the distributed ledger at a corresponding local BCN such that the one or more transactions are immutably stored on the distributed ledger and securely accessible by the plurality of BCNs in the ledger system, in particular, by system 102 in FIG. 1. As shown, data source 410 stores as transaction data, on its local BCN, data and/or metadata collected thereby (e.g., in the case of a cloud platform with data protection functionality, the data can be referred to as "snap transactions" associated with snapshots or data copies). As used herein, "metadata" is generally understood to refer to any data that describes, defines or otherwise characterizes other data.

Each node (BCN) within a blockchain system (e.g., system 402) contains a full copy of the entire ledger in some embodiments. The distributed ledger can be navigated by a dashboard 404 (graphical user interface) to obtain and present a view 406 of data collected by the various data sources in FIG. 1.

Every data transaction (data collected for use by system 102) is entered into the blockchain via the local node. For example, as shown in example in FIG. 4, data source 410 enters transaction data to its local BCN (local node B). These transactions are grouped into "blocks" (A, B, C, D) and the most recent block (D in this example) points back to the last block in the chain (e.g. block "C"). Note that the letter at the bottom of each block refers to the previous block, and block A is called the genesis block since it is the first block created. The view 406 of this chain of blocks can be displayed to a user at any of the local nodes.

Given the distributed data management ledger system illustrated in FIG. 4, illustrative embodiments are provided that implement geo-location data enhancement of data collected by the various data sources 110 through 120. These illustrative embodiments will be described below in the context of FIGS. 5A and 5B. However, it is to be appreciated that while embodiments are well-suited for implementation in a ledger system configured as shown in FIG. 4, other ledger systems can be adapted to implement the data compliance management techniques described herein.

FIG. 5A illustrates content arrival and generation of a transaction with creation metadata added to the distributed data management ledger system of FIG. 4. More particularly, FIG. 5A illustrates an example 500 wherein content metadata 502 is created at the time a data set is collected by a data source connected to the distributed ledger system 402 via a local node. Transaction 504 is created and securely stored on the blockchain that is part of the ledger system, as described above.

However, as mentioned above, precise geographic locations of elements in the event being modeled are needed by multi-dimensional event model generation system 102. Illustrative embodiments address this and other scenarios by providing geo-extraction and geo-based policy placement techniques. As used herein, the prefix "geo" is short for "geographic" or "geography."

More particularly, FIG. 5B illustrates content arrival with geo-extraction and geo-based policy placement operations during generation of a transaction with creation metadata that is added to the distributed data management ledger system of FIG. 4. Example 510 is similar to example 500 (FIG. 5A) with the exception that content metadata 512 is presented to a geo-extractor (GE) module 514 which is configured to recognize any kind of geographic point of origin metadata arriving in any protocol and to translate that metadata into a common superstructure or normalized data structure. This normalized geo-metadata (locator) 516 is compared to one or more geo-policies 518 to determine the proper placement of the associated data set, e.g., an appropriate location such that system 102 can efficiently access the collected data for use in generating an event model. The geo-metadata is added (embedded) as metadata 520 to the transaction 522 as shown in FIG. 5B. FIG. 5B also highlights that once the geo-metadata is extracted from the content, the geo-policies 518 are consulted and the placement of the data (based on the policies) is recorded in the transaction (e.g., LOC B in transaction 522). Advantageously, the transaction holds the point of origin metadata which is timestamped, optionally check-summed, and immutably stored as a non-alterable historical record. During an audit, for example, if a piece of content is suspect, the transaction can be considered a trustworthy entry that was immediately entered upon creation of the content. In some embodiments, while geo-location data enhancement is employed, geo-policy directed placement is not included if not needed by system 102.

Furthermore, in some embodiments, multi-dimensional event model generation system 102 accesses the distributed data management ledger system 402 (described above in FIG. 4) through at least one of its one or more local BCN nodes to query the timestamp and geo-location information (described above in FIGS. 5A and 5B) in order to find relevant data sets, from the various data sources 110 through 120, to analyze and use to subsequently build the model 103.

Given the illustrative descriptions herein of embodiments configured to generate multi-dimensional event models, some non-limiting examples of events that can be modeled by the various embodiments are now described.

Traffic accidents. Recall that FIG. 2 shows one of the use cases, i.e., traffic accident 201, where a model generated in accordance with illustrative embodiments can be used to analyze a series of events over a specific time period, based on different data collected from multiple sources (e.g., vehicle cameras, radars, lidars, traffic cameras, security cameras from surrounding buildings, local weather stations, etc.).

For example, modelling a traffic accident event (e.g., 201 in FIG. 2) may require system 102 to merge 30 fps (frames per second) video from one car, 15 miles north from the event location, with another 60 fps video, taken by a traffic light camera, 35 miles south-west from the event location, which may also be captured at different angles (e.g., car camera may be 1 meter from the road surface, while the traffic light camera may be 3.5 meters from the road surface, plus cameras may have different resolutions). Further, different wind patterns may cause rain to distort an image from one source more than from another. System 102 is configured to resolve and synthesize these different data sources in generating an event model of the traffic accident.

Figure 6:
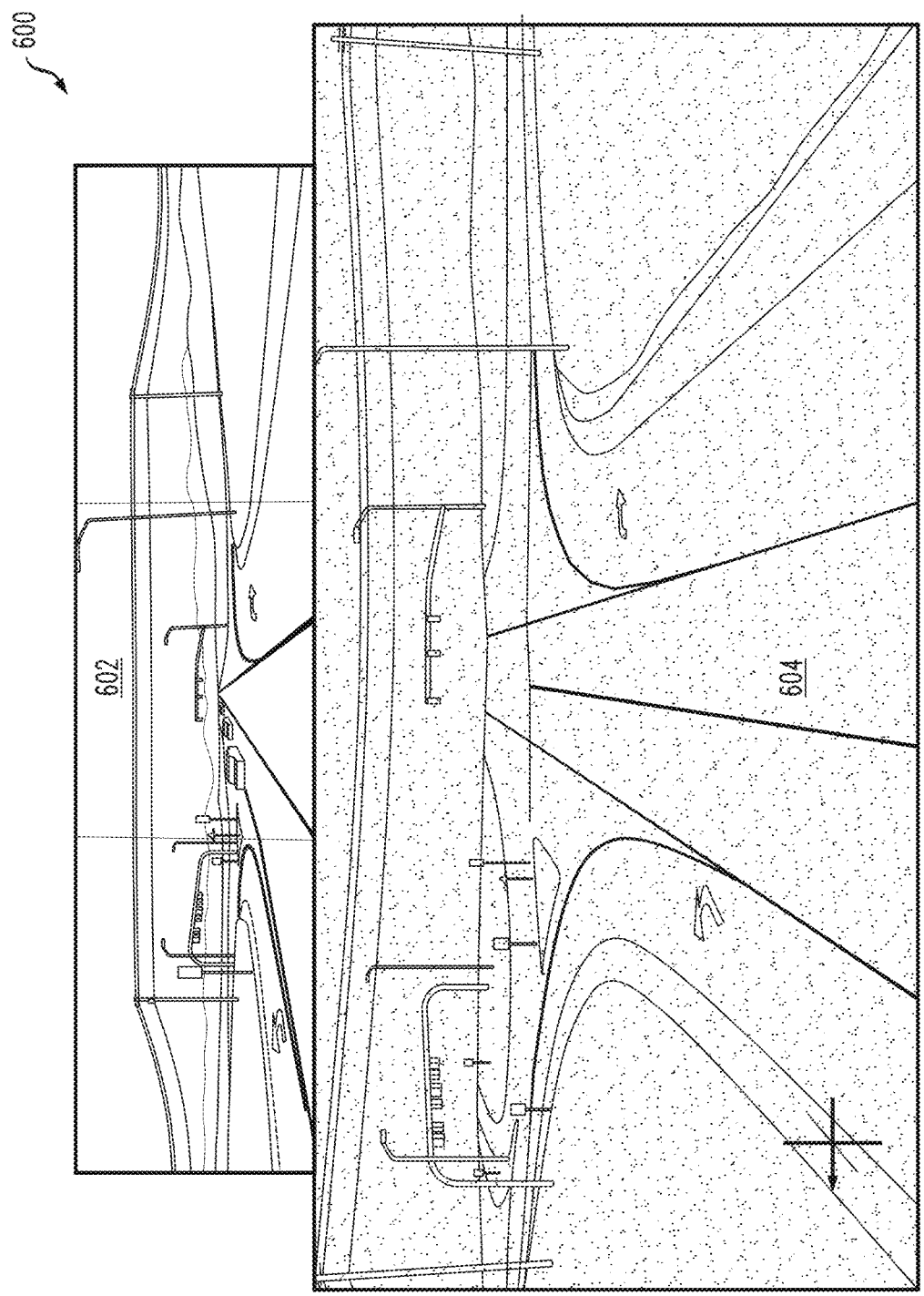
FIG. 6 illustrates a three-dimensional model of a traffic intersection generated with an information processing system configured to generate multi-dimensional event models, according to an illustrative embodiment.

FIG. 6 illustrates an example 600 of a physical intersection 602 modeled as a 3D representation 604 using event modeling techniques described herein.

Disasters past and future modeling. In the recent years, numerous disasters have occurred where technology could have played a role in helping ease the burden on first responders and also in saving lives. Non-limiting examples include wild fires in populated areas in Canada and California, earthquakes, hurricanes, etc. The use of autonomous and connected emergency vehicles and clusters of such vehicles configured as described herein can enable functionality and services that are not available at the most crucial time. The clusters of vehicles can also be used to capture and process multiple sets of real-time data and create models to learn from.

Agriculture/Mining prediction models. Agriculture and mining are two industry verticals that can illustrate the application of one or more embodiments described herein in a very specific way. In the case of mining, especially the world's largest mines in Australia and South America, the operators rely on local maps that are neither accurate nor updatable. The integration of AI and industrial IoT sensor and communication assets embedded in vehicles used inside the mines helps bridge some of these gaps. The application of a geo-twin model generated in accordance with illustrative embodiments enables more accuracy and extracts richer information for the simulation scenarios to address the various use cases. Similarly, in the agriculture industry, especially in remote areas and hard to reach environments, the modeling techniques described herein can be applied to achieve the same goals.

Figure 7:
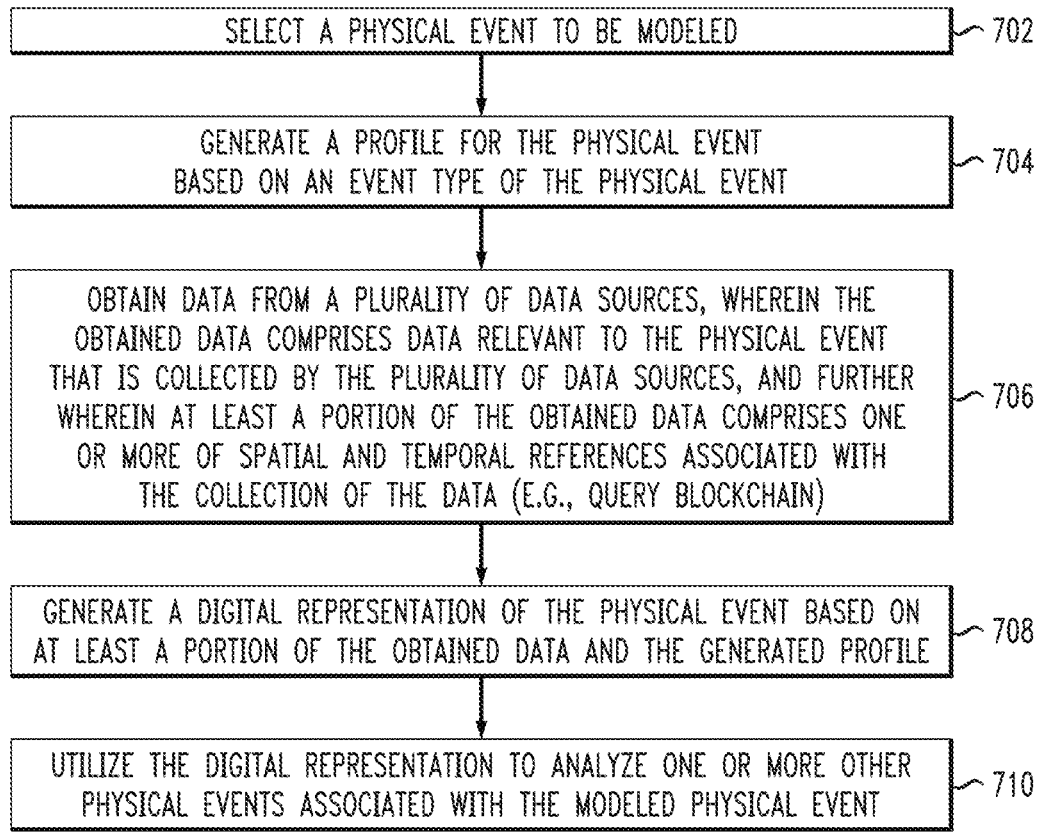
FIG. 7 illustrates a methodology for generating multi-dimensional event models, according to an illustrative embodiment.

Given the illustrative description of event modeling techniques herein, FIG. 7 depicts a methodology for generating multi-dimensional event models, according to illustrative embodiments.

In FIG. 7, methodology 700 comprises the following steps. A physical event to be modeled is selected in step 702. A profile for the physical event is generated based on an event type of the physical event in step 704. Data is obtained from a plurality of data sources in step 706, wherein the obtained data comprises data relevant to the physical event that is collected by the plurality of data sources, and further wherein at least a portion of the obtained data comprises one or more of spatial and temporal references associated with the collection of the data. A digital representation of the physical event is generated based on at least a portion of the obtained data and the generated profile in step 708. In one example, system 102 queries the distributed ledger system (e.g., blockchain) to obtain transaction data based on the one or more of spatial (geo-location) and temporal (timestamp) references. The digital representation is then utilized to analyze one or more other physical events associated with the modeled physical event in step 710.

The particular processing operations and other system functionality described in conjunction with the flow diagrams of FIGS. 3 and 7 are presented by way of illustrative example only, and should not be construed as limiting the scope of the disclosure in any way. Alternative embodiments can use other types of processing operations for generating a multi-dimensional event model. For example, the ordering of the process steps may be varied in other embodiments, or certain steps may be performed at least in part concurrently with one another rather than serially. Also, one or more of the process steps may be repeated periodically, or multiple instances of the process can be performed in parallel with one another in order to implement a plurality of different multi-dimensional event model generation processes for respective different data sets within a given information processing system.

At least portions of systems and methods for generating multi-dimensional event models shown in FIGS. 1-7 may be implemented using one or more processing platforms associated with one or more information processing systems. In some embodiments, a given such processing platform comprises at least one processing device comprising a processor coupled to a memory. The processor and memory in some embodiments comprise respective processor and memory elements of a virtual machine or container provided using one or more underlying physical machines. The term "processing device" as used herein is intended to be broadly construed so as to encompass a wide variety of different arrangements of physical processors, memories and other device components as well as virtual instances of such components. For example, a "processing device" in some embodiments can comprise or be executed across one or more virtual processors. Processing devices can therefore be physical or virtual and can be executed across one or more physical or virtual processors. It should also be noted that a given virtual device can be mapped to a portion of a physical one. In many embodiments, logic may be executed across one or more physical or virtual processors. In certain embodiments, a virtual processor may be mapped to and executed on or across a portion of one or more virtual or physical processors.

As is apparent from the above, one or more of the processing modules or other components of the systems and methods for generating multi-dimensional event models in FIGS. 1-7 may each run on a computer, server, storage device or other processing platform element. A given such element may be viewed as an example of what is more generally referred to herein as a "processing device." An example of such a processing platform is processing platform 800 shown in FIG. 8.

The processing platform 800 in this embodiment comprises a plurality of processing devices, denoted 802-1, 802-2, 802-3, . . . 802-N, which communicate with one another over a network 804.

The network 804 may comprise any type of network, including by way of example a global computer network such as the Internet, a WAN, a LAN, a satellite network, a telephone or cable network, a cellular network, a wireless network such as a WiFi or WiMAX network, or various portions or combinations of these and other types of networks.

As mentioned previously, some networks utilized in a given embodiment may comprise high-speed local networks in which associated processing devices communicate with one another utilizing Peripheral Component Interconnect Express (PCIe) cards of those devices, and networking protocols such as InfiniBand, Gigabit Ethernet or Fibre Channel.

The processing device 802-1 in the processing platform 800 comprises a processor 810 coupled to a memory 812.

The processor 810 may comprise a microprocessor, a microcontroller, an application-specific integrated circuit (ASIC), a field-programmable gate array (FPGA) or other type of processing circuitry, as well as portions or combinations of such circuitry elements.

The memory 812 may comprise random access memory (RAM), read-only memory (ROM) or other types of memory, in any combination. The memory 812 and other memories disclosed herein should be viewed as illustrative examples of what are more generally referred to as "processor-readable storage media" storing executable program code of one or more software programs.

Articles of manufacture comprising such processor-readable storage media are considered embodiments of the present disclosure. A given such article of manufacture may comprise, for example, a storage array, a storage disk or an integrated circuit containing RAM, ROM or other electronic memory, or any of a wide variety of other types of computer program products. The term "article of manufacture" as used herein should be understood to exclude transitory, propagating signals. Numerous other types of computer program products comprising processor-readable storage media can be used.

Figure 8:
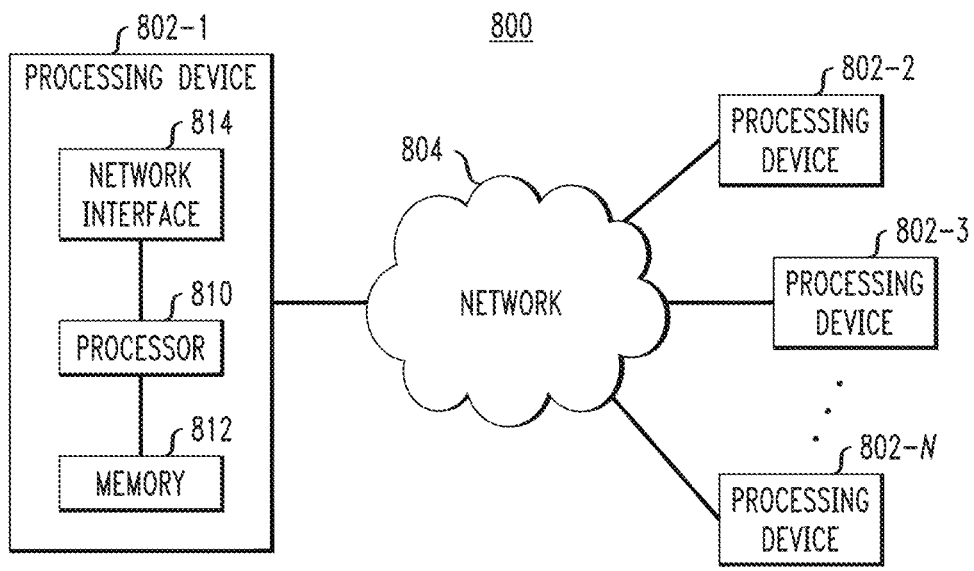
FIG. 8 illustrates a processing platform used to implement at least a portion of an information processing system for generating multi-dimensional event models, according to an illustrative embodiment.

Also included in the processing device 802-1 of the example embodiment of FIG. 8 is network interface circuitry 814, which is used to interface the processing device with the network 804 and other system components, and may comprise conventional transceivers.

The other processing devices 802 of the processing platform 800 are assumed to be configured in a manner similar to that shown for processing device 802-1 in the figure.

Again, this particular processing platform is presented by way of example only, and other embodiments may include additional or alternative processing platforms, as well as numerous distinct processing platforms in any combination, with each such platform comprising one or more computers, servers, storage devices or other processing devices.

For example, other processing platforms used to implement embodiments of the disclosure can comprise different types of virtualization infrastructure, in place of or in addition to virtualization infrastructure comprising virtual machines. Such virtualization infrastructure illustratively includes container-based virtualization infrastructure configured to provide Docker containers or other types of Linux containers (LXCs).

The containers may be associated with respective tenants of a multi-tenant environment, although in other embodiments a given tenant can have multiple containers. The containers may be utilized to implement a variety of different types of functionality within the system. For example, containers can be used to implement respective cloud compute nodes or cloud storage nodes of a cloud computing and storage system. The compute nodes or storage nodes may be associated with respective cloud tenants of a multi-tenant environment. Containers may be used in combination with other virtualization infrastructure such as virtual machines implemented using a hypervisor.

As another example, portions of a given processing platform in some embodiments can comprise converged infrastructure such as VxRail™, VxRack™ or Vblock® converged infrastructure commercially available from VCE, the Virtual Computing Environment Company, now the Converged Platform and Solutions Division of Dell EMC. For example, portions of a system of the type disclosed herein can be implemented utilizing converged infrastructure.

It should therefore be understood that in other embodiments different arrangements of additional or alternative elements may be used. In many embodiments, at least a subset of these elements may be collectively implemented on a common processing platform, or each such element may be implemented on a separate processing platform.

Also, in other embodiments, numerous other arrangements of computers, servers, storage devices or other components are possible in the systems and methods for generating multi-dimensional event models. Such components can communicate with other elements of the system over any type of network or other communication media.

As indicated previously, in some embodiments, components of the systems and methods for generating multi-dimensional event models as disclosed herein can be implemented at least in part in the form of one or more software programs stored in memory and executed by a processor of a processing device. For example, at least portions of the execution environment or other system components are illustratively implemented in one or more embodiments the form of software running on a processing platform comprising one or more processing devices.

It should again be emphasized that the above-described embodiments of the disclosure are presented for purposes of illustration only. Many variations and other alternative embodiments may be used. For example, the disclosed techniques are applicable to a wide variety of other types of systems. Also, the particular configurations of system and device elements, associated processing operations and other functionality illustrated in the drawings can be varied in other embodiments. Moreover, the various assumptions made above in the course of describing the illustrative embodiments should also be viewed as exemplary rather than as requirements or limitations of the embodiments. Numerous other alternative embodiments within the scope of the appended claims will be readily apparent to those skilled in the art.

What is claimed is:

1. A method comprising:
   selecting a physical event to be modeled;
   generating a profile for the physical event based on an event type of the physical event;
   obtaining data from a plurality of data sources, wherein the obtained data comprises data relevant to the physical event that is collected by the plurality of data sources, wherein the plurality of data sources comprises different data source types;
   generating in real-time a digital representation of the physical event based on at least a portion of the obtained data and the generated profile; and
   utilizing the digital representation to model or simulate one or more past or future physical events related to the modeled physical event;
   wherein generating the profile comprises generating one or more qualitative scores for attributes of the profile, the attributes comprising one or more of participating elements, geo-locations and time references associated with the physical event;
   wherein obtaining data comprises comparing the at least a portion of the obtained data with the one or more qualitative scores for the attributes to identify the data relevant to the physical event;
   wherein at least one of the plurality of data sources comprises a cluster of connected vehicles configured with mobile compute platforms, wherein at least a portion of the connected vehicles comprise a portion of the plurality of data sources; and
   wherein the method is implemented via one or more processing devices each comprising a processor coupled to a memory.

2. The method of claim 1, wherein the at least a portion of the obtained data comprises geographic location information associated with one or more elements associated with the physical event.

3. The method of claim 2, wherein the at least a portion of the obtained data comprises one or more timestamp information associated with the collection of the obtained data by the plurality of data sources.

4. The method of claim 1, wherein the digital representation comprises a multi-dimensional model of the physical event.

5. The method of claim 3, wherein the data obtaining step further comprises accessing transaction data, the transaction being stored in a distributed ledger system.

6. The method of claim 5, wherein the accessing step further comprises querying the distributed ledger system to obtain the transaction data relevant to the physical event based on the geographical information and the timestamp information of the transaction data.

7. The method of claim 1, wherein at least one of the plurality of data sources comprises traffic control infrastructure, wherein at least a portion of the traffic control infrastructure is involved in the physical event being modeled.

8. The method of claim 1, wherein at least one of the plurality of data sources comprises a satellite data source positioned to collect data relevant to the physical event being modeled.

9. The method of claim 1, wherein at least one of the plurality of data sources comprises a cloud platform configured to collect data relevant to the physical event being modeled.

10. An article of manufacture comprising a non-transitory processor-readable storage medium having stored therein program code of one or more software programs, wherein the program code when executed by at least one processing device causes said at least one processing device to perform steps of:
    selecting a physical event to be modeled;
    generating a profile for the physical event based on an event type of the physical event;
    obtaining data from a plurality of data sources, wherein the obtained data comprises data relevant to the physical event that is collected by the plurality of data sources, wherein the plurality of data sources comprises different data source types;
    generating in real-time a digital representation of the physical event based on at least a portion of the obtained data and the generated profile; and
    utilizing the digital representation to model or simulate one or more past or future physical events related to the modeled physical event;
    wherein generating the profile comprises generating one or more qualitative scores for attributes of the profile, the attributes comprising one or more of participating elements, geo-locations and time references associated with the physical event;
    wherein obtaining data comprises comparing the at least a portion of the obtained data with the one or more qualitative scores for the attributes to identify the data relevant to the physical event; and wherein at least one of the plurality of data sources comprises a cluster of connected vehicles configured with mobile compute platforms, wherein at least a portion of the connected vehicles comprise a portion of the plurality of data sources.

11. A system comprising:
one or more processing devices configured to:
select a physical event to be modeled;
generate a profile for the physical event based on an event type of the physical event;
obtain data from a plurality of data sources, wherein the obtained data comprises data relevant to the physical event that is collected by the plurality of data sources, wherein the plurality of data sources comprises different data source types;
generate in real-time a digital representation of the physical event based on at least a portion of the obtained data and the generated profile; and
utilize the digital representation to model or simulate one or more past or future physical events related to the modeled physical event;
wherein generating the profile comprises generating one or more qualitative scores for attributes of the profile, the attributes comprising one or more of participating elements, geo-locations and time references associated with the physical event;
wherein obtaining data comprises comparing the at least a portion of the obtained data with the one or more qualitative scores for the attributes to identify the data relevant to the physical event; and
wherein at least one of the plurality of data sources comprises a cluster of connected vehicles configured with mobile compute platforms, wherein at least a portion of the connected vehicles comprise a portion of the plurality of data sources.

12. The system of claim 11, wherein the obtained data comprises geographic location information associated with one or more elements associated with the physical event.

13. The system of claim 12, wherein the obtained data comprises timestamp information associated with the collection of the obtained data by the plurality of data sources.

14. The system of claim 11, wherein the digital representation comprises a multi-dimensional model of the physical event.

15. The system of claim 13, wherein the one or more processing devices are further configured to access transaction data stored in a distributed ledger system.

16. The system of claim 15, wherein the one or more processing devices are further configured to query the distributed ledger system to obtain the transaction data relevant to the physical event based on the geographical information and the timestamp information of the transaction data.

17. The system of claim 11, wherein the plurality of data sources comprises one or more of:
traffic control infrastructure, wherein at least a portion of the traffic control infrastructure is involved in the physical event being modeled;
a satellite data source positioned to collect data relevant to the physical event being modeled; and
a cloud platform configured to collect data relevant to the physical event being modeled.

18. The method of claim 1, wherein the plurality of data sources comprises one or more of audio sensors and video sensors.

19. The article of manufacture of claim 10, wherein the plurality of data sources further comprises at least one of:
traffic control infrastructure, wherein at least a portion of the traffic control infrastructure is involved in the physical event being modeled;
a satellite data source positioned to collect data relevant to the physical event being modeled; and
a cloud platform configured to collect data relevant to the physical event being modeled.

20. The system of claim 11, wherein the plurality of data sources further comprises at least one of:
traffic control infrastructure, wherein at least a portion of the traffic control infrastructure is involved in the physical event being modeled;
a satellite data source positioned to collect data relevant to the physical event being modeled; and
a cloud platform configured to collect data relevant to the physical event being modeled.

* * * * *